United States Patent [19]

Miyata et al.

[11] Patent Number: 4,533,593
[45] Date of Patent: Aug. 6, 1985

[54] ANTIREFLECTION COATING FOR POTASSIUM CHLORIDE

[75] Inventors: Takeo Miyata; Takuhiro Ono; Takashi Iwabuchi, all of Kanagawa, Japan

[73] Assignee: Agency of Industrial Science and Technology, Tokyo, Japan

[21] Appl. No.: 533,273

[22] Filed: Sep. 16, 1983

[51] Int. Cl.³ .................. B32B 7/00; B32B 15/04; G02B 5/26

[52] U.S. Cl. .................. 428/215; 428/333; 428/336; 428/699; 350/1.6; 350/164; 350/166

[58] Field of Search ............. 350/1.3, 164, 165, 166, 350/1.6; 428/215, 333, 336, 699

[56] References Cited

U.S. PATENT DOCUMENTS

| | | | |
|---|---|---|---|
| 3,421,811 | 1/1969 | Edwards et al. | 350/166 |
| 3,463,574 | 8/1969 | Bastien et al. | 350/166 |
| 3,883,214 | 3/1975 | Hoffman | 350/165 |
| 3,934,961 | 1/1976 | Itoh et al. | 428/213 |
| 4,075,385 | 2/1978 | Baer et al. | 428/215 |
| 4,422,721 | 12/1983 | Hahn et al. | 350/164 |
| 4,436,363 | 3/1984 | Steinbruegge et al. | 350/1.6 |

OTHER PUBLICATIONS

J. E. Rudisill, M. Braunstein, and A. I. Braunstein, Optical Coatings for High Energy ZnSe Laser Windows, pp. 2075, 2076, Table 1.
A. D. Baer, T. M. Donovan, A. K. Green and G. Turner, Alternate Materials for Infrared Window Coatings, NBS. Special Publication 462, pp. 214, 216, Table 2.
A. D. McLachlan and W. E. K. Gibbs, A New Chalcogenide-Glass Antireflection Coating for KC, Laser Induced Damage in Optical Materials, NBS Special Publication 509, pp. 222, 223, Table 1.
R. C. Weast, Editor: Handbook of Chemistry and Physics, 50th Edition, published by the Chemical Rubber Co.
M. Braunstein: Infrared Coatings for High Energy Laser Reflectors and Windows, Proceedings of the Society of Photo-Optical Instrumental Engineers, vol. 140, Optical Coatings II, p. 85.

Primary Examiner—Marion E. McCamish
Assistant Examiner—William M. Atkinson
Attorney, Agent, or Firm—Burgess, Ryan & Wayne

[57] ABSTRACT

An antireflection coating for a potassium chloride substrate has a first arsenic trisulfide ($As_2S_3$) layer, a lead fluoride ($PbF_2$) layer and a second arsenic trisulfide ($As_2S_3$) layer which are formed on at least one major surface of the potassium chloride (KCl) substrate in the order named. The antireflection coating withstands to irradiate of a high-power carbon dioxide gas laser. The antireflection coating also has good optical characteristics and moisture resistance.

2 Claims, 6 Drawing Figures

ANTIREFLECTION COATING FOR POTASSIUM CHLORIDE

BACKGROUND OF THE INVENTION (1) Field of the Invention

The present invention relates to an antireflection coating for a potassium chloride substrate of a transparent optical component such as a window and a lens which are obtained using potassium chloride.

(2) Description of the Prior Art

Materials such as ZnSe and GaAs are used as substrate materials for transparent optical components such as a window, a lens and a beam splitter for a high-power carbon dioxide gas laser. ZnSe is a transparent material at wavelengths of 10.6 $\mu$m and 0.6328 $\mu$m, has good moisture resistance, and yields large crystals. Although ZnSe has the above advantages, it is expensive and causes a large optical distortion upon high-power irradiation. In addition to these disadvantages, a toxic gas such as $H_2Se$ gas must be used at the time of crystal growth, and a toxic selenium gas is generated during the crystal finish process. Thus, ZnSe cannot provide suitable safety guarantees.

GaAs is a transparent material at a wavelength of 10.6 $\mu$m. The heat conductivity of GaAs is three times that of ZnSe, and GaAs has good moisture resistance. Although GaAs has the above advantages, it also has disadvantages in that a GaAs crystal having a diameter of more than 8 cm is not available, and that GaAs does not transmit an He-Ne laser beam (having a wavelength of 0.6328 $\mu$m) for visible light superposition therethrough. In addition to these disadvantages, GaAs is expensive and has a large optical distortion. Furthermore, arsenic (As) contained in GaAs is a toxic element, so that safety measures must be provided during the manufacturing process.

KCl is transparent at wavelengths of both 10.6 $\mu$m and 0.6328 $\mu$m, nontoxic, and low in cost. KCl also has a small optic distortion. Although KCl has such several advantages, it is not used as a substrate of a commercially available transparent optical component (e.g., window and lens) since KCl is hygroscopic. If a bare KCl is used in a high humidity, it cannot withstand the humidity over a long period of time. However, if an antireflection coating for a KCl substrate is developed wherein the antireflection coating has a substantially zero reflectance at a wavelength of 10.6 $\mu$m, becomes transparent at a wavelength of 0.6328 $\mu$m, and has good moisture resistance, a satisfactory KCl window and lens can be obtained. However, at present, such an antireflection coating having good optical characteristics and good moisture resistance is not available.

At present, antireflection coatings for the commercially available KCl windows and KCl lenses are made of NaF single layer. The refractive index of NaF is 1.23, which is very close to the square root ($\sqrt{1.45} = 1.20_4$) of the refractive index of KCl. Therefore, it is expected that an ideal reflectance of 0.05% can be obtained if an NaF antireflection coating having an optical thickness $nd = \lambda/4 = 2.65$ $\mu$m is deposited on a KCl substrate. The present inventors purchased from a US manufacturer a KCl window (having a diameter of one inch and a thickness of 5 mm) having antireflection NaF coatings on two sides thereof, and a reflectance of this KCl window was measured at a wavelength of 10.6 $\mu$m. The reflectance was about 0.4%, and an absorption was about 0.3%. It was thus found that this KCl window had sufficient optical characteristics for practical use. However, when the KCl window was subjected to an environmental test at a temperature of 45° C. and a relative humidity of 95%, the NaF coatings peeled off from the KCl substrate in six hours. Therefore, this NaF antireflection coating is unsatisfactory in practice from the viewpoint of moisture resistance.

Any other single layer antireflection coating excluding the NaF coating does not satisfy the above conditions of the antireflection coating. Two- or three-layer antireflection coatings must be considered. The required conditions of a material of the antireflection coatings are that it be substantially insoluble to water, and transparent at wavelengths of 10.6 $\mu$m and 0.6328 $\mu$m. In addition to these conditions, the antireflection coatings must provide good adhesion to the substrate and be made of a material which is amorphous and when formed into a thin coating does not form pinholes. Chalcogenide glass such as arsenic trisulfide ($As_2S_3$) and arsenic triselenide ($As_2Se_3$) and thorium tetrafluoride ($ThF_4$) are promising materials.

SUMMARY OF THE INVENTION

It is, therefore, an object of the present invention to provide a moisture-resistant antireflection coating for a potassium chloride substrate, which does not substantially absorb a carbon dioxide gas laser beam (wavelength of 10.6 $\mu$m) and sufficiently transmits an He-Ne laser beam (wavelength of 0.6328 $\mu$m) therethrough.

According to an aspect of the present invention, there is provided an antireflection coating for a potassium chloride substrate, comprising a first arsenic trisulfide ($As_2S_3$) layer, a lead fluoride ($PbF_2$) layer and a second arsenic trisulfide ($As_2S_3$) layer which are formed on at least one major surface of the potassium chloride (KCl) substrate in the order named.

According to another aspect of the present invention, there is also provided an antireflection coating for a potassium chloride substrate, wherein the first arsenic trisulfide ($As_2S_3$) layer, the lead fluoride ($PbF_2$) layer and the second arsenic trisulfide ($As_2S_3$) layer have optical thicknesses falling in ranges between 2.438 $\mu$m and 2.650 $\mu$m, between 1.259 $\mu$m and 1.363 $\mu$m, and between 0.959 $\mu$m and 1.038 82 m, respectively.

DETAILED DESCRIPTION OF THE PREFERRED EMBODIMENTS

The following structures are possible two-layer antireflection coatings that could be formed on a KCl substrate:

(a) KCl//GATS/As$_2$S$_3$
(b) KCl//As$_2$S$_3$/ThF$_4$
(c) KCl//As$_2$S$_3$/PbF$_2$

The two-layer antireflection coating represented by structure (a) contains chalcogenide glass and thus has good moisture resistance and small heat dissipation (small absorption ratio at a wavelength of 10.6 μm). However, GATS is disadvantageous in that it does not transmit light having a wavelength of 0.6328 μm. The two-layer antireflection coating represented by structure (b) exhibits an amorphous state, and ThF$_4$ has good mechanical strength. However, ThF$_4$ is radioactive. In addition to this disadvantage, high-purity ThF$_4$ having a low absorption is difficult to obtain. The two-layer antireflection coating represented by structure (c) has a low absorption, but PbF$_2$ cannot be formed into a thin amorphous coating and has poor moisture resistance.

Figure 1:
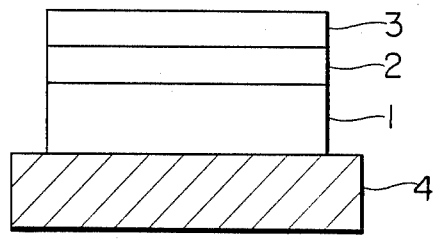
FIG. 1 is a sectional view for explaining an antireflection coating for a KCl substrate according to an embodiment of the present invention.

FIG. 1 is a sectional view showing a three-layer antireflection coating formed on a KCl substrate according to the present invention. Reference numeral 4 denotes a KCl substrate having a refractive index $n_s$ of 1.45. The two major surfaces of the KCl substrate are optically polished to a high precision. Reference numeral 1 denotes a first As$_2$S$_3$ layer having a refractive index $n_1$ of 2.31. The first As$_2$S$_3$ layer 1 has an optical thickness $n_1d_1$ (=2.54 μm) where $d_1$ is a thickness of the first As$_2$S$_3$ layer. Reference numeral 2 denotes a PbF$_2$ layer having a refractive index $n_2$ of 1.67. The PbF$_2$ layer 2 has an optical thickness $n_2d_2$ (=1.311 μm) where $d_2$ is a thickness of the PbF$_2$ layer 2. Reference numeral 3 denotes a second As$_2$S$_3$ layer having a refractive index $n_3$ of 2.31. The second As$_2$S$_3$ layer 3 has an optical thickness $n_3d_3$ (=0.999 μm) where $d_3$ is a thickness of the second As$_2$S$_3$ layer 3. The optical thicknesses of the above layers are preset to satisfy the Mouchart expression (Applied Optics vol. 16, No. 10, P. 2722) concerning a three-layer antireflection coating. The dependence of the reflectances on the wavelengths are shown in FIGS. 2, 3 and 4, when the optical thickness $n_id_i$ (i=1, ..., 3) of the second As$_2$S$_3$ layer 3, the PbF$_2$ layer 2 and the first As$_2$S$_3$ layer 1, respectively, is increased and decreased by 4% from the preset optical thickness.

Figure 2:
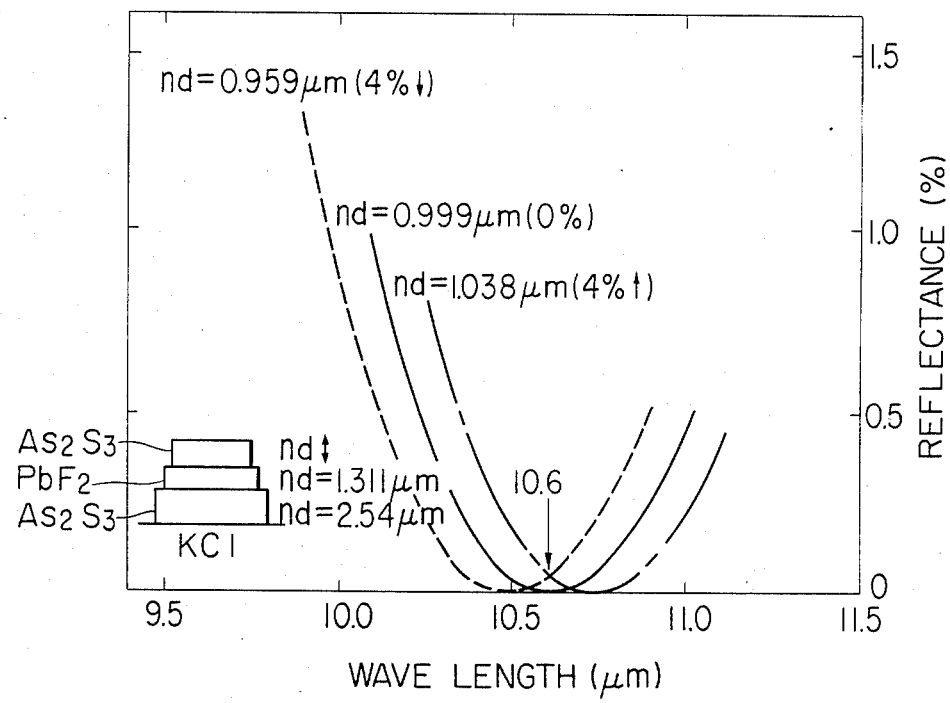
FIG. 2 is a graph for explaining the dependence of the reflectance on the wavelength when an optical thickness of a second $As_2S_3$ layer is increased and decreased by 4% from the preset optical thicknesses.

FIG. 2 shows the dependence of the antireflection coatings reflectance on the wavelength when only the optical thickness of the second As$_2$S$_3$ layer formed on the PbF$_2$ layer is varied. More particularly, the first As$_2$S$_3$ layer formed on the KCl substrate and the PbF$_2$ layer formed on the first As$_2$S$_3$ layer had optical thicknesses of 2.54 μm and 1.311 μm, respectively. The optical thickness of the second As$_2$S$_3$ layer formed on the PbF$_2$ layer was varied within the range between 0.959 μm and 1.038 μm. A reflectance of the antireflection coatings was as good as about 0.1% at a wavelength of 10.6 μm.

Figure 3:
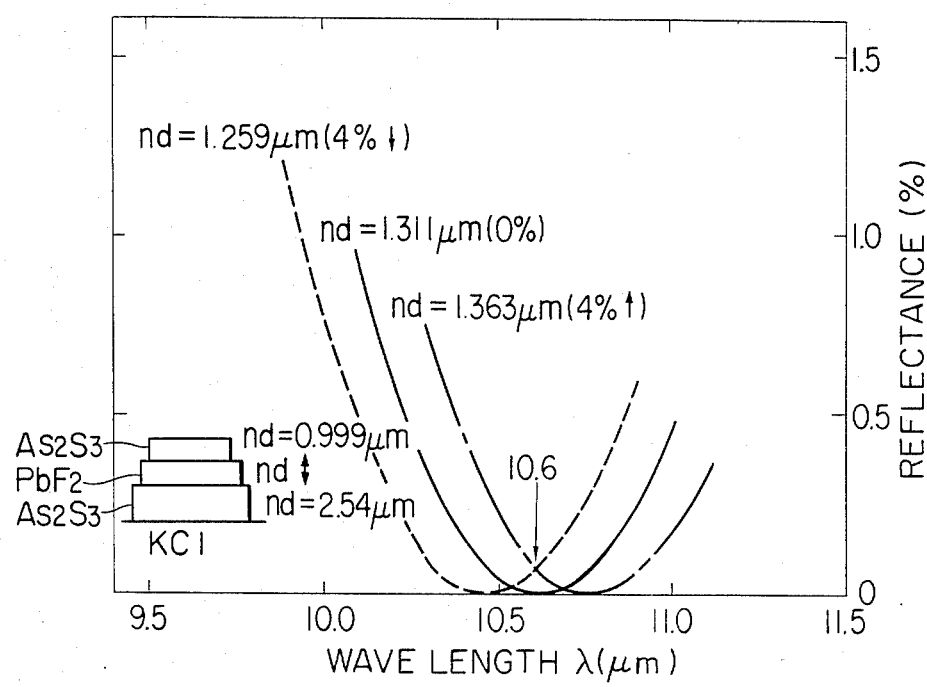
FIG. 3 is a graph for explaining the dependence of the reflectance on the wavelength when an optical thickness of a $PbF_2$ layer is increased and decreased by 4% from the preset optical thickness.

FIG. 3 shows the dependence of the antireflection coatings reflectance on the wavelength when only the optical thickness of the PbF$_2$ layer is varied. More particularly, the first As$_2$S$_3$ layer formed on the KCl substrate and the second As$_2$S$_3$ layer had optical thicknesses of 2.54 μm and 0.999 μm, respectively. The optical thickness of the PbF$_2$ layer was varied within the range between 1.259 μm and 1.363 μm. A reflectance of the antireflection coatings was about 0.1% at a wavelength of 10.6 μm.

Figure 4:
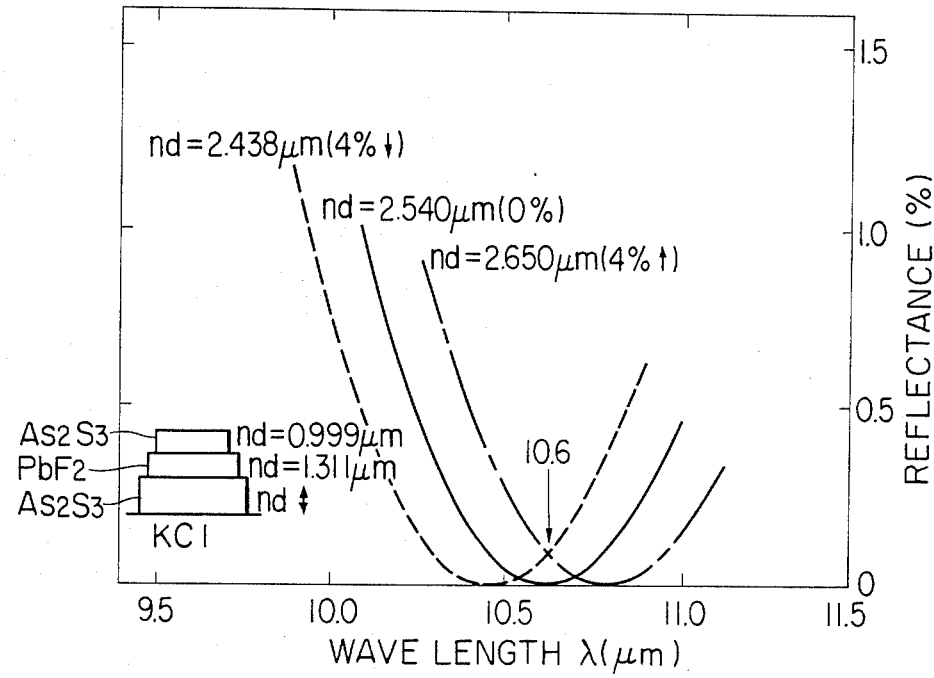
FIG. 4 is a graph for explaining the dependence of the reflectance on the wavelength when an optical thickness of a first $As_2S_3$ layer is increased and decreased by 4% from the preset optical thickness.

FIG. 4 shows the dependence of the antireflection coatings reflectance on the wavelength when only the optical thickness of the first As$_2$S$_3$ layer is varied. More particularly, the PbF$_2$ layer and the second As$_2$S$_3$ layer had optical thicknesses of 1.311 μm and 0.999 μm, respectively. The optical thickness of the first As$_2$S$_3$ layer was varied within the range between 2.438 μm and 2.650 μm. A reflectance of the antireflection coatings was about 0.1% at a wavelength of 10.6 μm.

Figure 5:
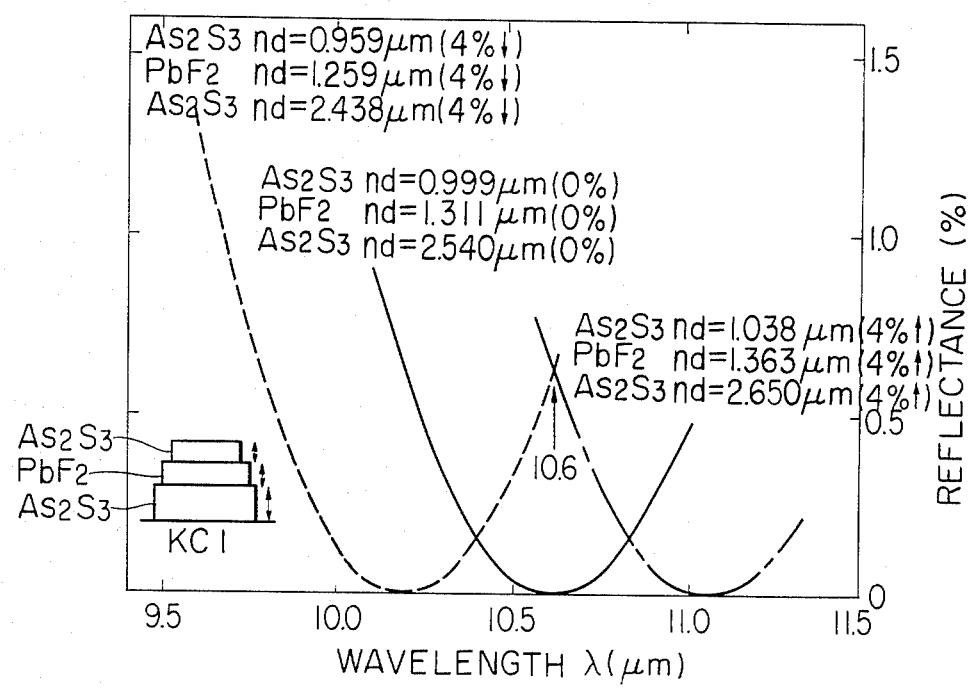
FIG. 5 is a graph for explaining the dependence of the reflectance on the wavelength when the optical thickness of all of the first $As_2S_3$ layer, the $PbF_2$ layer and the second $As_2S_3$ layer which are formed on a KCl substrate is simultaneously increased and simultaneously decreased by 4% from the respective preset optical thicknesses.

FIG. 5 shows the dependence of the antireflection coatings reflectance on the wavelength when the optical thicknesses of all of the layers are simultaneously increased by 4% and simultaneously decreased by 4%. In this case, the reflectance of the antireflection coatings was about 0.5% at a wavelength of 10.6 μm. When the antireflection coatings are formed on both major surfaces of the substrate, a reflectance thereof becomes about 1% which is within the allowable range.

As has been apparent from FIGS. 2 to 5, the optical thicknesses of the first As$_2$S$_3$ layer, the PbF$_2$ layer and the second As$_2$S$_3$ layer preferably fall within ranges between 2.438 μm and 2.650 μm, between 1.259 μm and 1.363 μm, and between 0.959 μm and 1.038 μm, respectively.

A KCl substrate manufactured by Janos Optical Corp (U.S.A.) was used as the KCl substrate for manufacturing a sample. This KCl substrate had a diameter of one inch, a thickness of 5 mm, and a polished surface. A molybdenum (Mo) boat for depositing an As$_2$S$_3$ layer on the substrate had a cover having a hole for preventing spitting. A substrate temperature was 70° C., a working pressure was $1.5 \times 10^{-8}$ Torr, and a deposition rate was 12 Å/sec Using a platinum (Pt) boat, PbF$_2$ was then deposited on the first As$_2$S$_3$ layer at a substrate temperature of 118° C, at a working pressure of $3 \times 10^{-5}$ Torr, and at a deposition rate of 12 Å/sec. During deposition, the substrate was rotated and orbited within a deposition chamber so as to form a uniform layer thereon. The deposition rate was controlled by a quartz oscillator. The depostion thickness was measured by a transmitting optical monitor using an infrared ray having a wavelength of 2.17 μm.

Figure 6:
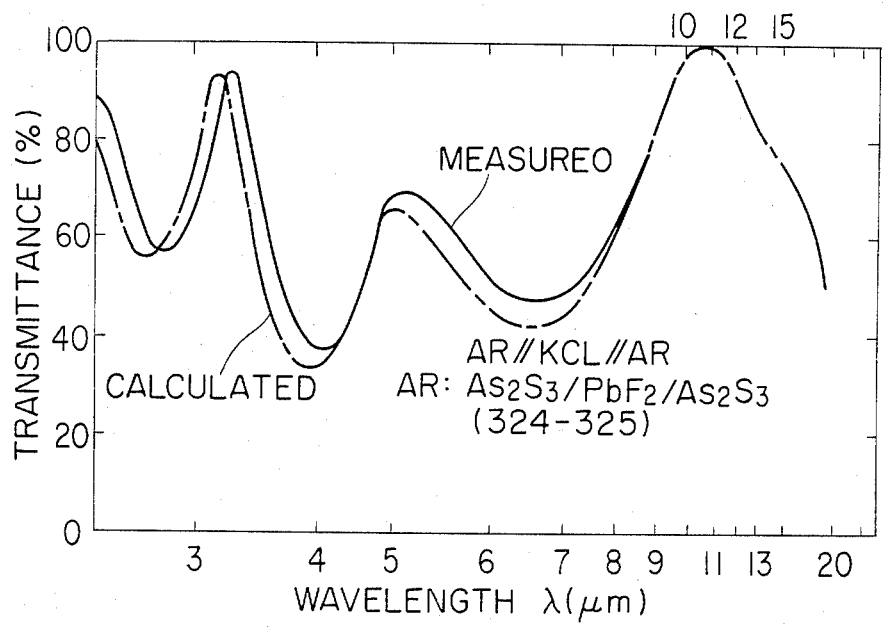
FIG. 6 is a graph for explaining a comparison between measured values and corresponding calculated values in the transmittance spectra of a KCl window formed by depositing antireflection coatings of the present invention on both sides of the KCl substrate.

The transmission spectra of the resultant sample were measured, and are shown in FIG. 6. The measured values properly matched the calculated values in the wavelength range between 8 μm and 13 μm.

The each measured values of total absorption of six samples were 0.21%, 0.13%, 0.13%, 0.12%, 0.23% and 0.18% when a carbon dioxide gas laser beam having a wavelength of 10.6 μm was irradiated on the samples. The mean value of the absorption was 0.17%. The mean absorption of the KCl substrate was given in the order of 0.14%. A difference between the mean absorption of the samples and that of the KCl was about 0.03%. As a result, an antireflection coating having a very small absorption ratio was obtained. Even under irradiation of a high-power laser having a power of 20 kW, the antireflection coatings of the present invention can be satisfactorily used.

A laser irradiation damage threshold test was conducted. The values of the laser irradiation damage threshold cannot be uniquely determined because depend on the laser beam irradiation conditions. The irradiation conditions include the size of a laser beam spot relative to the size of the sample, the method of cooling of the sample, irradiation in air or vacuum, and the irradiation time. Therefore, the experimental conditions are given as follows:

(1) Irradiation was performed in air.

(2) The sample was naturally cooled in the air.

(3) The sample had a diameter of one inch, and the laser beam spot had a diameter of about 1 mm.

(4) A CW carbon dioxide gas laser having an output power of 500 W was used as a laser source. A laser beam in the single mode having a diameter of about 7 mm was converged by a ZnSe meniscus lens (focal length of 2.5 inches). The laser beam having an energy density of 70 kW/cm$^2$ irradiated the sample for 2 minutes, and the surface of the sample was examined for evaluation.

No change in surface states of the samples was found from before to after irradiation under the test conditions described above.

Humidity test results will be described hereinafter. The polished KCl substrate abruptly absorbs moisture when a relative humidity is increased to 80% or more. The weight of the KCl substrate is increased upon absorption of moisture. In order to test the moisture resistance of the antireflection coatings with respect to the KCl substrate, the samples were placed in an atmosphere (Tabai thermostat PR-2) at a temperature of 45° C. and a relative humidity of 95%. The samples were removed from the thermostat at predetermined intervals of time and the surfaces of the samples were microphotographed to check any damage.

No damage was found to the antireflection coatings of the present invention after 650 hours had elapsed. However, when water was dripped onto the antireflection coatings, water was absorbed through a pin hole in one minute. It was found that the antireflection coatings peeled off slightly. It was thus found that the antireflection coatings of the present invention could be practically used in normal conditions wherein no dews is present on the coating surfaces.

The characteristics of the antireflection coatings for a KCl substrate are summarized as follows:

(1) The absorption of the antireflection coating is in the order of about 0.015% when a carbon dioxide gas laser beam having a wavelength of 10.6 μm irradiates the surface of the antireflection coatings. Therefore, the antireflection coating of the present invention can be used upon irradiation by high-power laser having an output power of 20 kW.

(2) The antireflection coating of the present invention will not be damaged even after 650 hours of an environmental test at a temperature of 45° C. and a relative humidity of 95%. Therefore, the antireflection coating of the present invention is proved to be sufficiently acceptable in practice.

(3) Even if the optical thickness of all of three layers is simultaneously decreased by 4% or increased by 4%, the reflectance of the antireflection coating as a whole does not vary by more than 0.5%.

(4) The antireflection coating of the present invention will not be damaged even if a laser beam having an energy density of 70 kW/cm$^2$ irradiates the surface of the antireflection coating for 2 minutes.

(5) Since the antireflection coating of the present invention is transparent when an He-Ne laser beam having a wavelength of 0.6328 μm irradiates its surface, beam alignment can be easily performed.

What is claimed is:

1. An antireflection coating for a potassium chloride substrate, said coating comprising a first arsenic trisulfide ($As_2S_3$) layer, a lead fluoride ($PbF_2$) layer and a second arsenic trisulfide ($As_2S_3$) layer which are formed on at least one major surface of the potassium chloride (KCl) substrate in the order named.

2. A layer according to claim 1, wherein the first arsenic trisulfide ($As_2S_3$) layer, the lead fluoride ($PbF_2$) layer and the second arsenic trisulfide ($As_2S_3$) layer have optical thicknesses falling in ranges between 2.438 μm and 2.650 μm, between 1.259 μm and 1.363 μm, and between 0.959 μm and 1.038 μm, respectively.

* * * * *